United States Patent
Chien

(10) Patent No.: US 7,242,256 B2
(45) Date of Patent: Jul. 10, 2007

(54) PHASE FREQUENCY DETECTOR WITH PROGRAMMABLE DELAY

(75) Inventor: Hung-Ming Chien, Irvine, CA (US)

(73) Assignee: Broadcom Corporation, Irvine, CA (US)

(*) Notice: Subject to any disclaimer, the term of this patent is extended or adjusted under 35 U.S.C. 154(b) by 169 days.

(21) Appl. No.: 11/084,335

(22) Filed: Mar. 18, 2005

(65) Prior Publication Data
US 2006/0208803 A1    Sep. 21, 2006

(51) Int. Cl.
*H03L 7/00*    (2006.01)
(52) U.S. Cl. ............................................. 331/25; 327/8
(58) Field of Classification Search ............... 331/25; 327/8
See application file for complete search history.

(56) References Cited

U.S. PATENT DOCUMENTS 6,320,424 B1* 11/2001 Kurd et al. ..................... 327/8
6,441,691 B1* 8/2002 Jones et al. ................... 331/25
2005/0017775 A1* 1/2005 Starr ........................... 327/156

* cited by examiner

*Primary Examiner*—Joseph Chang
(74) *Attorney, Agent, or Firm*—McAndrews, Held & Malloy, Ltd.

(57) ABSTRACT

Methods and systems for locking a phase locked loop (PLL) are disclosed herein. A first impulse signal may be generated utilizing an input reference signal. A second impulse signal may be generated utilizing an input divided signal. A programmable delay signal may be generated based on the generated first impulse signal and the generated second impulse signal. The generation of the first impulse signal and the generation of the second impulse signal may be controlled via the generated programmable delay signal. The generated first impulse signal and the generated second impulse signal may be delayed utilizing a programmable delay. The delayed first impulse signal and the delayed second impulse signal may be ANDed to generate the programmable delay signal, and the generated programmable delay signal may comprise a reset signal.

22 Claims, 9 Drawing Sheets

PHASE FREQUENCY DETECTOR WITH PROGRAMMABLE DELAY

RELATED APPLICATIONS

[Not Applicable]

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to processing signals. More specifically, certain embodiments of the invention relate to a method and system for phase frequency detection with programmable delay.

BACKGROUND OF THE INVENTION

Modern communication devices, such as 802.x enabled communication devices, may utilize a conventional transceiver to transmit and/or receive signals with variable signal strength. One or more voltage controlled oscillator (VCO) circuits may be utilized within the conventional transceiver to generate oscillator reference signals with a specific output frequency and/or phase. The generated oscillator reference signals may then be utilized by a transmitter and/or by a receiver within the 802.x enabled device to facilitate processing of a received signal and/or processing of a signal prior to transmission. A phase frequency detector may also be utilized in a phase locked loop (PLL) for controlling the VCO to generate an output signal with desired frequency.

The voltage controlled oscillator circuits within the conventional transceiver may be adapted to generate one or more differential frequency output signals. Outputs of these voltage controlled oscillator circuits may be coupled to one or more divider circuits, for example, that divide the generated differential frequency output signals for subsequent use by other circuits within the transceiver. The voltage controlled oscillators, however, are sensitive to loading from these divider circuits and/or from other interconnections. Large capacitance from loading and/or resistance created by divider circuits and line routing may decrease the quality factor and limit performance of the voltage controlled oscillator circuits within the transceiver.

In this regard, the desired output frequency of the differential output signal generated by the voltage controlled oscillator may change and re-calibration may be required. In addition, variations caused by environmental factors and PTV may result in deviations in the desired output frequency of the differential output signals generated the VCO circuits. Consequently, a phase locked loop (PLL) may be required to control the VCO to generate output differential signals with desired output frequency.

Within the PLL, a phase frequency detector may be utilized to detect a phase and/or frequency difference between a reference signal and a voltage controlled oscillator output signal. Conventional phase frequency detectors, however, are characterized by increased overlapping time between up and down output signals of the phase frequency detector, which increases charge pump phase noise contribution and reference signal feedthrough in the voltage controlled oscillator output signal. An up output signal of the phase frequency detector may be generated when a first input signal leads a second input signals. For example, an up output signal may be generated when a reference input signal leads a VCO input signal. Similarly, a down output signal may be generated by the phase frequency detector when the reference input signal lags the VCO input signal.

In some instances, conventional phase frequency detectors are characterized by reduced overlapping time between the up and down output signals of the phase frequency detector. Consequently, "dead zone" effects significantly increase because of the reduced overlapping time, resulting in increase in phase noise in the voltage controlled oscillator differential output signals.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for phase frequency detection with programmable delay, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for locking a phase locked loop (PLL). A phase frequency detector and a charge pump may be utilized to lock an output signal of a voltage controlled oscillator (VCO) and a reference signal so that the VCO output signal has the same frequency and/or phase as the reference signal. One or more programmable delay circuits may be utilized to optimize the duration of an up and/or down output signal of the phase frequency detector. In this regard, "dead zone" effects in the charge pump may be avoided and phase noise in the voltage controlled oscillator output signal may be significantly reduced.

Figure 1:
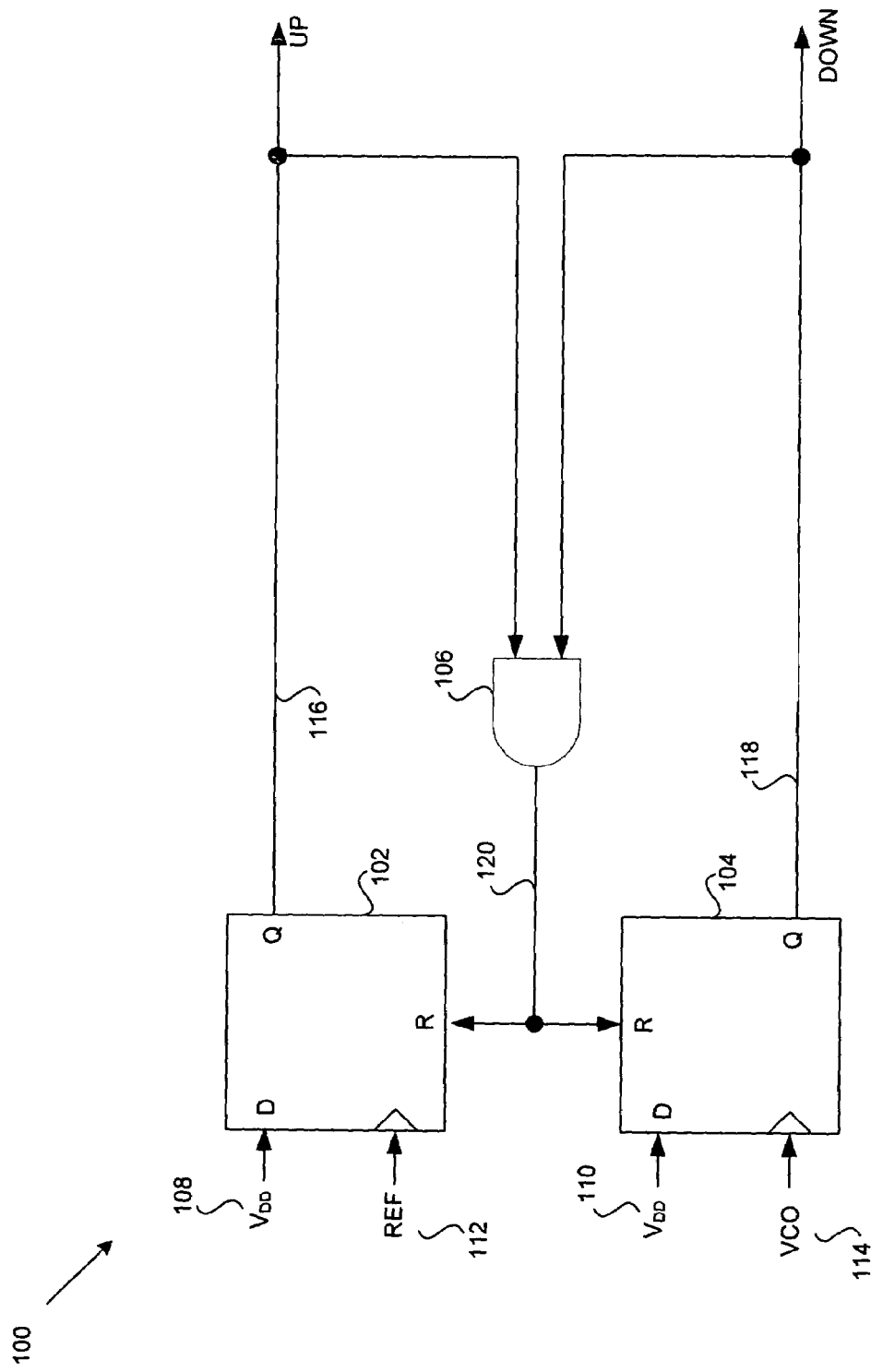
FIG. 1 is a block diagram illustrating a phase frequency detector circuit that may be utilized in accordance with an embodiment of the invention.

FIG. 1 is a block diagram illustrating a phase frequency detector circuit that may be utilized in accordance with an embodiment of the invention. Referring to FIG. 1, the phase frequency detector circuit 100 may comprise flipflops 102 and 104 and an AND gate 106. Flipflops 102 and 104 may comprise edge-triggered, resettable D flipflops with their D inputs 108 and 110 tied to logic ONE. For example, flipflop D inputs 108 and 110 may be connected to rail voltage $V_{DD}$. The clock input of the first flipflop 102 may be adapted to receive a reference signal 112, and the clock input of the second flipflop 104 may be adapted to receive a voltage controlled oscillator signal 114. The voltage controlled oscillator signal 114 may comprise a divided VCO output signal.

In operation, flipflops 102 and 104 may be edge-triggered and may be adapted to generate an up output impulse signal 116 and a down impulse output signal 118, depending on whether the reference signal 112 leads or lags the voltage controlled oscillator signal 114. For example, if the reference signal 112 leads the voltage controlled oscillator signal 114, the up output signal 116 may be generated first. The duration of an impulse of the up output signal 116 may comprise a duration beginning at a start of a rising edge of the input reference signal 112 and ending at a start of a rising edge of the input VCO signal 114. Similarly, if the reference signal 112 lags the voltage controlled oscillator signal 114, the down output signal 118 may be generated first. The duration of an impulse of the down output signal 118 may comprise a duration beginning at a start of a rising edge of the input VCO signal 114 and ending at a start of a rising edge of the input reference signal 112.

The AND gate 106 may be adapted to acquire the up and down output signals 116 and 118 and to generate an output reset signal 120 for resetting the flipflops 102 and 104. The AND gate 106 may be adapted to generate the reset signal 120 after detection of a rising edge for both the up output signal 116 and the down output signal 118.

In an exemplary aspect of the invention, overlapping time between the up output signal 116 and the down output signal 118 may be optimized by utilizing a programmable delay circuit, for example, to control the width of the impulses of the up output signal 116 and/or the down output signal 118 prior to logical ANDing the signals by the AND gate 106. In this regard, short and/or prolonged overlapping time between output signals 116 and 118 may be avoided. By increasing the overlapping time, a charge pump utilizing the output signals 116 and 118 may operate with reduced "dead zone" effects since transistor switches within the charge pump may have sufficient time to switch between generating positive and negative charges. By decreasing the overlapping time, charge pump phase noise contribution and reference signal feedthrough effects are significantly reduced.

Figure 2:
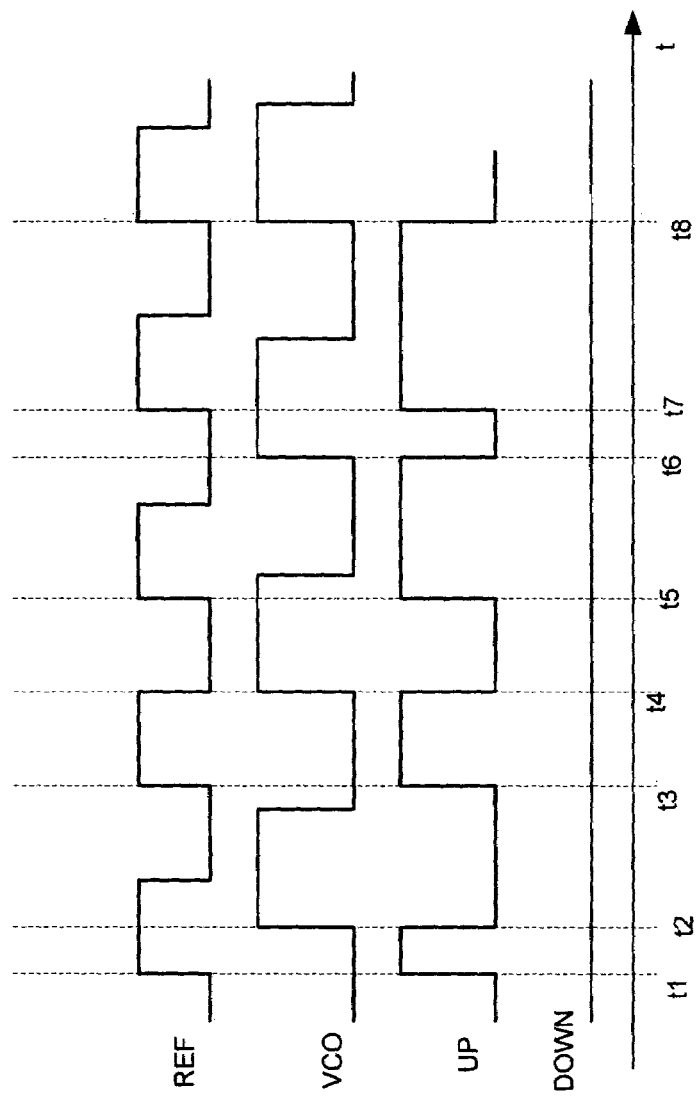
FIG. 2 is a timing diagram of exemplary input and output signals of the phase frequency detector of FIG. 1, for example, in accordance with an embodiment of the invention.

FIG. 2 is a timing diagram of exemplary input and output signals of the phase frequency detector of FIG. 1, for example, in accordance with an embodiment of the invention. Referring to FIGS. 1 and 2, in an exemplary aspect of the invention, the input reference signal 112 at the clock input of flipflop 102 may lead the input voltage controlled oscillator signal 114 at the clock input of flipflop 104. In operation, at time t1, the phase frequency detector circuit 100 may utilize flipflop 102 to detect a rising edge of the input reference signal 112. At time t2, flipflop 104 may detect a rising edge of the input VCO signal 114. Flipflop 102 may then generate the output up signal 116 with an impulse duration of (t2−t1), corresponding to the duration between detection of the rising edge of reference signal 112 and detection of a subsequent rising edge of the VCO signal 114.

Similarly, the phase frequency detector circuit 100 may generate subsequent impulses of the output up signal 116, with impulse durations of (t4−t3), (t6−t5), and (t8−t7). In one embodiment of the invention, the generated output up signal impulses may be utilized by a charge pump to generate a positive charge based on the duration of the impulse. The positive charge may then be utilized to adjust phase and/or frequency of the voltage controlled oscillator output signal 114 so that its phase and/or frequency matches that of the reference signal 112.

Figure 3:
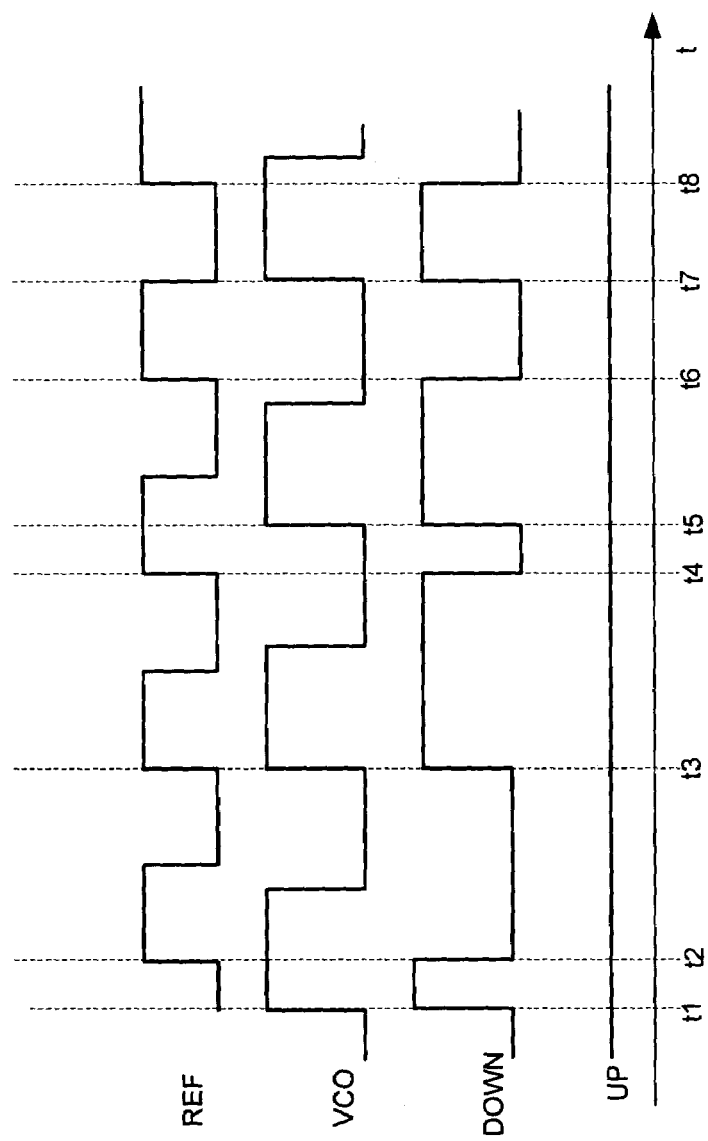
FIG. 3 is a timing diagram of exemplary input and output signals of the phase frequency detector of FIG. 1, for example, in accordance with an embodiment of the invention.

FIG. 3 is a timing diagram of exemplary input and output signals of the phase frequency detector of FIG. 1, for example, in accordance with an embodiment of the invention. Referring to FIGS. 1 and 3, in an exemplary aspect of the invention, the input reference signal 112 at the clock input of flipflop 102 may lag the input voltage controlled oscillator signal 114 at the clock input of flipflop 104. In operation, at time t1, the phase frequency detector circuit 100 may utilize flipflop 104 to detect a rising edge of the input VCO signal 114. At time t2, flipflop 102 may detect a rising edge of the input reference signal 112. Flipflop 104 may then generate the output down signal 118 with an impulse duration of (t2−t1), corresponding to the duration between detection of the rising edge of the VCO signal 114 and detection of a subsequent rising edge of the reference signal 112.

Similarly, the phase frequency detector circuit 100 may generate subsequent impulses of the output down signal 118, with impulse durations of (t4−t3), (t6−t5), and (t8−t7). In one embodiment of the invention, the generated output down signal impulses may be utilized by a charge pump to generate a negative charge based on the duration of the impulse. The negative charge may then be utilized to adjust phase and/or a frequency of the voltage controlled oscillator output signal 114 so that its phase and/or frequency matches that of the reference signal 112.

Figure 4:
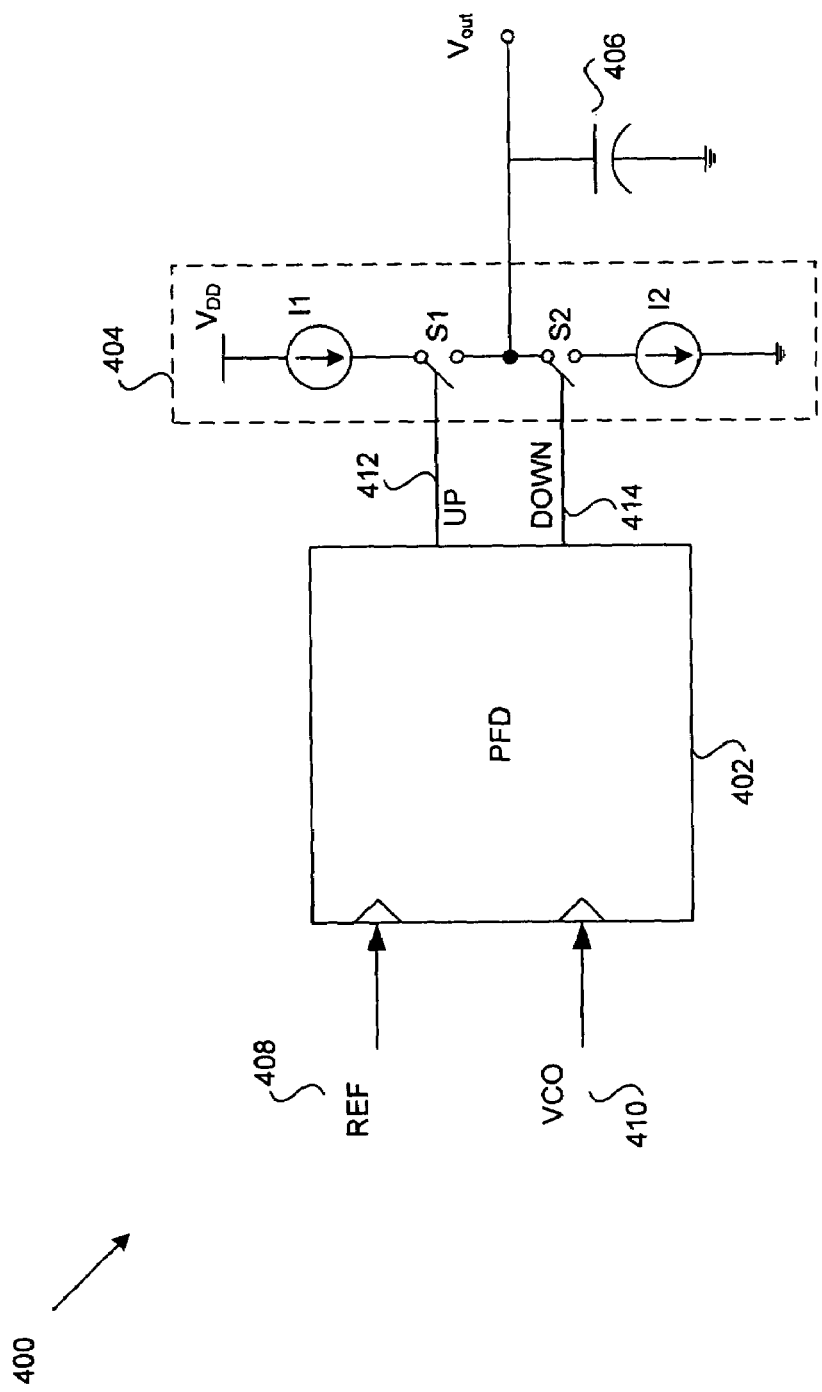
FIG. 4 is a block diagram illustrating a phase frequency processing circuit with a charge pump that may be utilized in accordance with an embodiment of the invention.

FIG. 4 is a block diagram illustrating a phase frequency processing circuit with a charge pump that may be utilized in accordance with an embodiment of the invention. Referring to FIG. 4, the phase frequency processing circuit 400 may comprise a phase frequency detector 402, a charge pump 404, and a capacitor 406. The phase frequency detector 402 may comprise suitable circuitry and/or logic and may be adapted to acquire an input reference signal 408 and an input voltage controlled oscillator signal 410 and generate output up and down signals 412 and 414, respectively. In one aspect of the invention, the phase frequency detector 402 may comprise the phase frequency detector circuit 100 of FIG. 1. The generated output up and down signals 412 and 414 may be based on whether the input reference signal leads or lags the input VCO signal 410.

The charge pump 404 may comprise a reference voltage source $V_{DD}$, current sources I1 and I2, and switches S1 and S2. Switches S1 and S2 may be controlled by signal impulses in the output up and down signals 412 and 414, respectively. Switches S1 and S2 may be implemented utilizing transistors, such as NMOS transistors, for example. The charge pump may be adapted to generate an output charge, which may be stored by the capacitor 406 for subsequent processing.

In operation, the phase frequency detector 402 may be adapted to generate an up output impulse signal 412 and a down impulse output signal 414, depending on whether the reference signal 408 leads or lags the voltage controlled oscillator signal 410. For example, if the reference signal 408 leads the voltage controlled oscillator signal 410, the up output signal 412 may be generated first. The duration of an impulse of the up output signal 412 may comprise a duration that begins at a start of a rising edge of the input reference signal 408 and ends at a start of a rising edge of the input VCO signal 410. Similarly, if the reference signal 408 lags the voltage controlled oscillator signal 410, the down output signal 414 may be generated first. The duration of an impulse of the down output signal 414 may comprise a duration that begins at a start of a rising edge of the input VCO signal 410 and ends at a start of a rising edge of the input reference signal 408.

The charge pump 404 may be adapted to acquire the output up and down signals 412 and 414 and generate an output charge $V_{out}$, which may be stored by the capacitor 406. For example, if the reference signal 408 leads the VCO signal 410, the output up signal 412 may be generated first. The output up signal 412 may be communicated to the charge pump 404 and may activate switch S1. After switch S1 is activated, a positive charge may be generated by the charge pump 404 and may be stored by the capacitor 406. Similarly, if the reference signal 408 lags the VCO signal 410, the output down signal 414 may be generated first. The output down signal 414 may be communicated to the charge pump 404 and may activate switch S2. After switch S2 is activated, a negative charge may be generated by the charge pump 404 and may be stored by the capacitor 406. Positive or negative charge stored by the capacitor 406 may be utilized by a voltage controlled oscillator in order to adjust phase and/or frequency of a VCO output signal 410 to match phase and/or frequency of the reference signal 408.

In an exemplary aspect of the invention, overlapping time between the up output signal 412 and the down output signal 414 may be optimized by utilizing a programmable delay circuit within the phase frequency detector 402, for example, to control the width of the impulses of the up output signal 412 and/or the down output signal 414. In this regard, an overlapping time between output signals 412 and 414, which is either too short or too long, may be avoided. By increasing an overlapping time that is too short, the charge pump 404 utilizing the output signals 412 and 414 may operate with reduced "dead zone" effects since transistor switches S1 and S2 within the charge pump 404 may have sufficient time to turn ON fully and generate an output charge proportional to the phase difference of the two input signals. By decreasing an overlapping time that is too long, charge pump phase noise contribution and reference signal 408 feedthrough effects may be significantly reduced.

Figure 5:
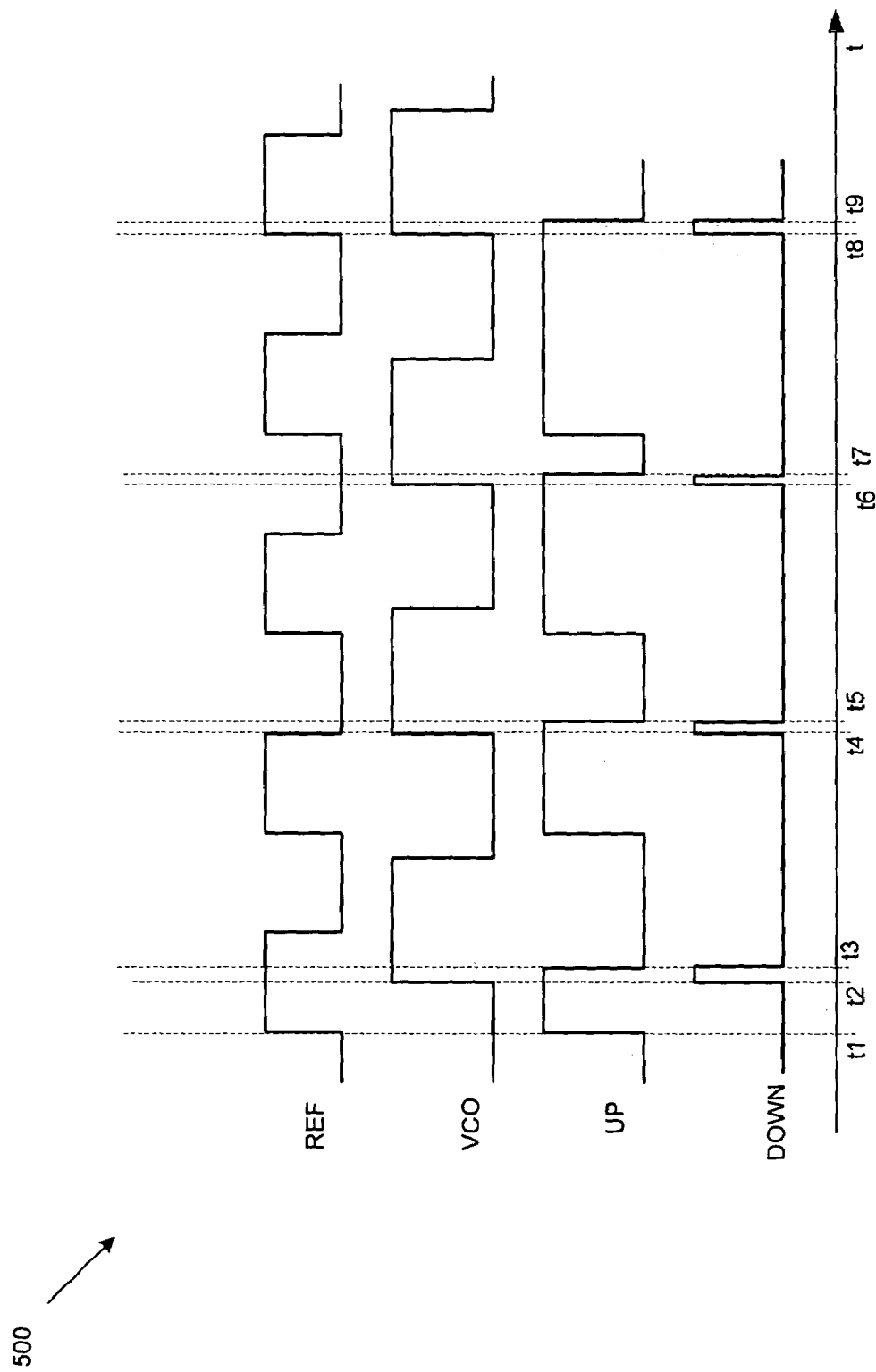
FIG. 5 is a timing diagram of exemplary input signals and partially overlapping output signals of the phase frequency detector of FIG. 4, for example, in accordance with an embodiment of the invention.

FIG. 5 is a timing diagram 500 of exemplary input signals and partially overlapping output signals of the phase frequency detector of FIG. 4, for example, in accordance with an embodiment of the invention. Referring to FIGS. 4 and 5, in an exemplary aspect of the invention, the input reference signal 408 may lead the input voltage controlled oscillator signal 410. In operation, at time t1, the phase frequency detector 402 may detect a rising edge of the input reference signal 408. Simultaneously, a rising edge of an impulse in the output up signal 412 may then be generated at time t1. At time t2, the phase frequency detector 402 may detect a rising edge of the input VCO signal 410. Simultaneously, a rising edge of an impulse in the output down signal 414 may then be generated at time t2. At time t2, therefore, the output up and down signals 412 and 414 are overlapping.

The phase frequency detector 402 may detect the overlapping signals and may generate a reset signal which may reset both the up and down output signals 412 and 414 to zero at time t3. The duration (t3–t2) of overlapping between signals 412 and 414 may be caused by gate delays, for example, characteristic of one or more logic gates utilized within the phase frequency detector 402. In another embodiment of the invention, overlapping time (t3–t2) between the up output signal 412 and the down output signal 414 may be optimized by utilizing a programmable delay circuit within the phase frequency detector 402, for example, to control the width of the impulses of the up output signal 412 and/or the down output signal 414. In this regard, "dead zone" effects and resulting phase noise may be significantly reduced. Similarly, the phase frequency detector circuit 400 may generate subsequent overlapping impulses of the output up signal 412 and the output down signal 414, with impulse durations of (t5–t4), (t7–t6), and (t9–t8).

Figure 6:
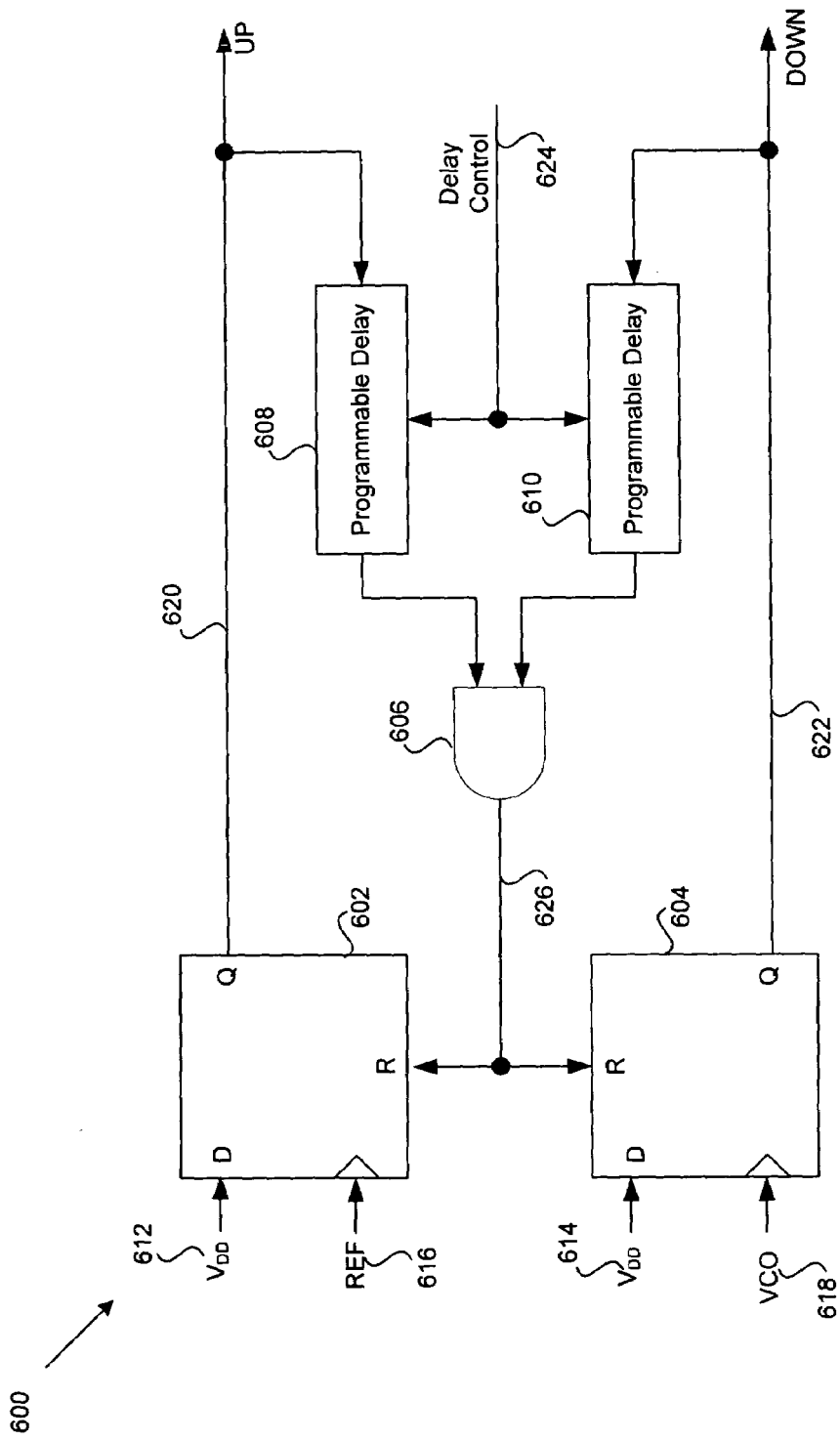
FIG. 6 is a block diagram illustrating a phase frequency detector circuit with programmable delay, in accordance with an embodiment of the invention.

FIG. 6 is a block diagram illustrating a phase frequency detector circuit with programmable delay, in accordance with an embodiment of the invention. Referring to FIG. 6, the phase frequency detector circuit 600 may comprise flipflops 602 and 604, an AND gate 606, and programmable delay circuits 608 and 610. Flipflops 602 and 604 may comprise edge-triggered, resettable D flipflops with their D inputs 612 and 614 tied to logic ONE. For example, flipflop D inputs 612 and 614 may be connected to rail voltage $V_{DD}$. The clock input of the first flipflop 602 may be adapted to receive a reference signal 616, and the clock input of the second flipflop 604 may be adapted to receive a voltage controlled oscillator signal 618. The voltage controlled oscillator signal 618 may comprise a divided VCO output signal, for example.

In operation, flipflops 602 and 604, which may be edge-triggered, may be adapted to generate an up output impulse signal 620 and a down impulse output signal 622, depending on whether the reference signal 616 leads or lags the voltage controlled oscillator signal 618. For example, if the reference signal 616 leads the voltage controlled oscillator signal 618, the up output signal 620 may be generated first. The duration of an impulse of the up output signal 620 may comprise duration between a rising edge of the input reference signal 616 and a rising edge of the input VCO signal 618. Similarly, if the reference signal 616 lags the voltage controlled oscillator signal 618, the down output signal 622 may be generated first. The duration of an impulse of the down output signal 622 may comprise duration between a rising edge of the input VCO signal 618 and a rising edge of the input reference signal 616.

The AND gate 606 may be adapted to acquire the up and down output signals 620 and 622 and to generate an output reset signal 626 for resetting the flipflops 602 and 604. The AND gate 606 may be adapted to generate the reset signal 626 after detection of a rising edge for both the up output signal 620 and the down output signal 622.

Programmable delay circuits 608 and 610 may comprise suitable circuitry, logic, and/or code and may be utilized to optimize the overlapping time between the up output signal 620 and the down output signal 622. For example, programmable delay circuits 608 and 610 may be utilized to control the width of the impulses of the up output signal 620 and/or the down output signal 622 prior to ANDing the signals by the AND gate 606. In this regard, short and/or prolonged overlapping time between output signals 620 and 622 may be avoided. By increasing short overlapping time that is too short, a charge pump utilizing the output signals 620 and 622 may operate with reduced "dead zone" effects since transistor switches within the charge pump may have sufficient time to turn ON fully and generate an output charge proportional to the phase difference of the two input signals. By decreasing overlapping time that is too long, charge pump phase noise contribution and reference signal 616 feedthrough effects are significantly reduced, thereby improving performance of the phase frequency detector circuit 600 and a subsequent voltage controlled oscillator.

Programmable delay circuits 608 and 610 may be optimized prior to operation of the phase frequency detector circuit 600. For example, a delay control signal 624 may be utilized to select a delay interval for the programmable delay circuits 608 and 610. In another aspect of the invention, the programmable delay circuits may be programmed and delay may be optimized on-the-fly.

Figure 7:
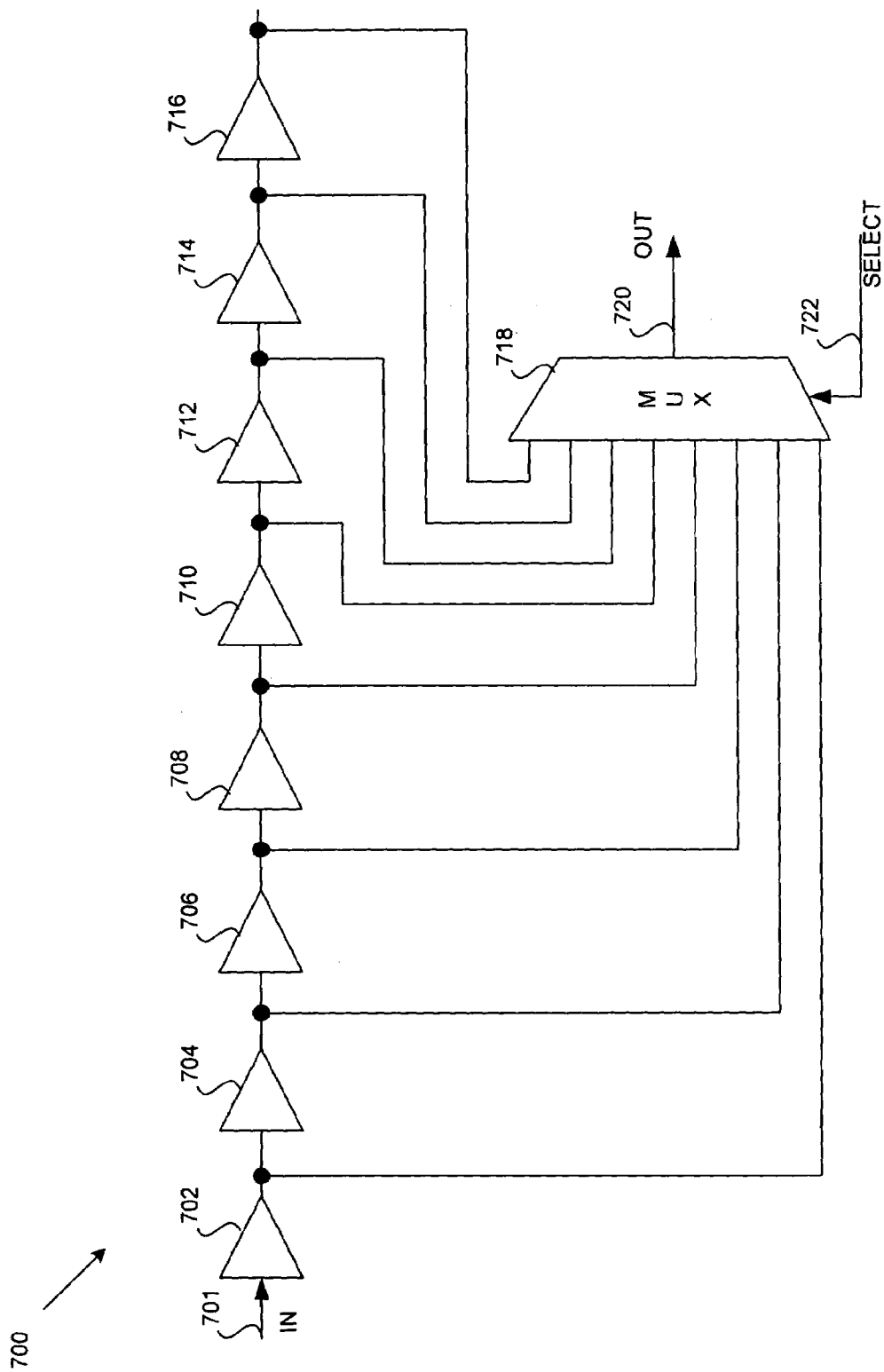
FIG. 7 is a block diagram of an exemplary programmable delay circuit that may be utilized in accordance with an embodiment of the invention.

FIG. 7 is a block diagram of an exemplary programmable delay circuit that may be utilized in accordance with an embodiment of the invention. Referring to FIG. 7, the exemplary programmable delay circuit 700 may comprise a plurality of buffers 702, . . . , 716 and a multiplexer 718. In operation, an input signal 701 may be communicated to the first buffer 702. The outputs of all buffers 702, . . . , 716 may be communicated as inputs to the multiplexer 718. The multiplexer 718 may be adapted to receive a select signal 722 and to select a signal output from a buffer based on the select signal 722. After a corresponding buffer output is selected, the multiplexer 718 may output the selected buffer output as output signal 720.

Even though the programmable delay circuit 700 comprises eight buffers, the present invention may not be so limited. The programmable delay circuit 700 may comprise a different number of buffers and/or other circuits to achieve signal delay.

Figure 8:
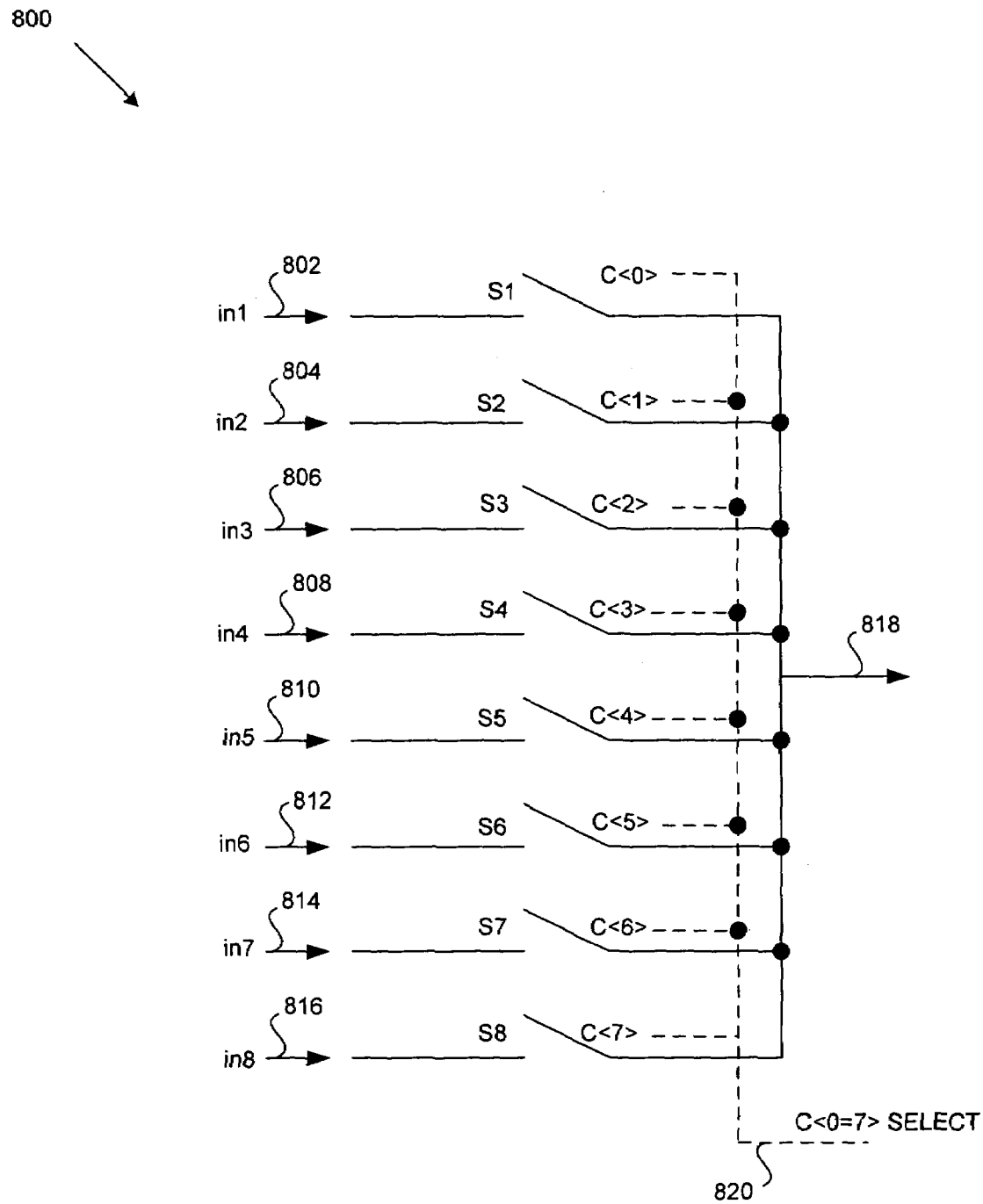
FIG. 8 is a block diagram of an exemplary eight input multiplexer that may be utilized in accordance with the exemplary programmable delay circuit of FIG. 7, for example, in accordance with an embodiment of the invention.

FIG. 8 is a block diagram of an exemplary eight input multiplexer that may be utilized in accordance with the exemplary programmable delay circuit of FIG. 7, for example, in accordance with an embodiment of the invention. Referring to FIG. 8, the eight input multiplexer 800 may comprise a plurality of switches S1, . . . , S8, coupled to input signals 802, . . . 816, respectively. Further, each of the multiplexer switches S1, . . . , S8 may be controlled by a corresponding signal C<0>, . . . , C<7>, respectively.

In operation, each of the input signals 802, . . . , 816 may be communicated to corresponding multiplexer switches S1, . . . , S8. The multiplexer 800 may then receive a select signal 820 for selecting a signal output. The multiplexer 800 may then activate one of the switches S1, . . . , S8, based on the select signal 820. After a selected switch is turned ON, a corresponding input signal may be communicated as an output signal 818.

Even though the multiplexer 800 comprises an eight input multiplexer, the present invention may not be so limited and a different number of inputs may be utilized. The number of signal inputs in the multiplexer 800 may correspond to a number of buffers, for example, within a programmable delay circuit utilizing the multiplexer 800.

Figure 9:
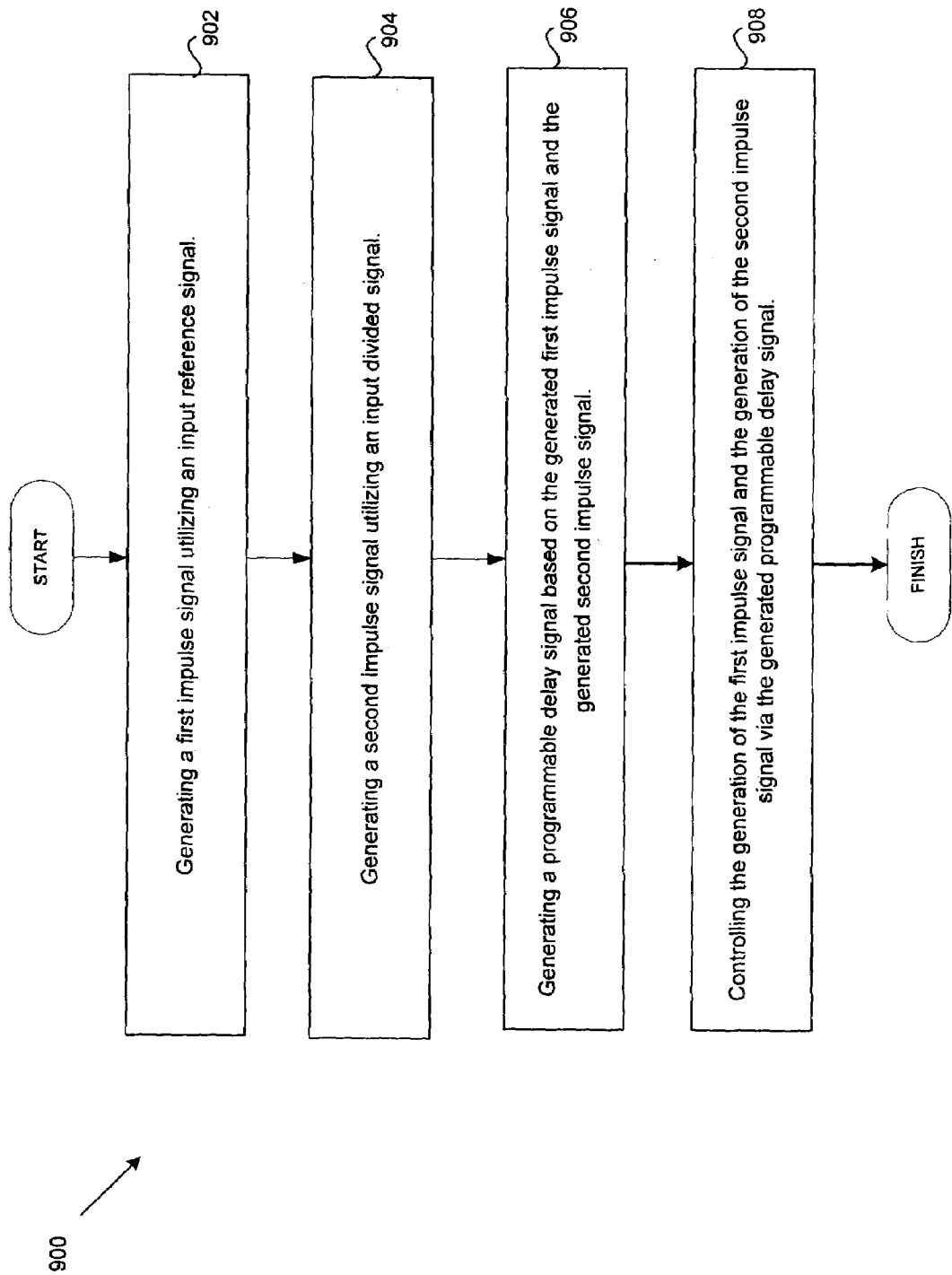
FIG. 9 is a flow diagram illustrating exemplary steps for locking a phase locked loop (PLL), in accordance with an embodiment of the invention.

FIG. 9 is a flow diagram illustrating exemplary steps for locking a phase locked loop (PLL), in accordance with an embodiment of the invention. Referring to FIG. 9, at 902, a first impulse signal may be generated utilizing an input reference signal. At 904, a second impulse signal may be generated utilizing an input divided signal. The input divided signal may comprise a voltage controlled oscillator output divided signal. At 906, a programmable delay signal may be generated based on the first impulse signal and the generated second impulse signal. At 908, the generation of the first impulse signal and the generation of the second impulse signal may be controlled via the generated programmable delay signal.

Referring again to FIG. 6, in an exemplary aspect of the invention, flipflop 602 may generate a first impulse signal 620 utilizing an input reference signal 616. The second flipflop 604 may generate a second impulse signal 622 utilizing an input divided signal. The programmable delay circuits 608 and 610 may generate programmable delay signals based on the generated first impulse signal and the generated second impulse signal. The first flipflop 602 may control the generation of the first impulse signal 620 and the second flipflop 604 may control the generation of the second impulse signal 622 via the generated programmable delay signals. The programmable delay circuits 608 and 610 may delay the generated first impulse signal 620 and the generated second impulse signal 622.

The AND gate 606 may logically AND the delayed first impulse signal 620 and the delayed second impulse signal 622 to generate programmable delay signal 626. The generated programmable delay signal 626 may comprise a reset signal. The first flipflop 602 may reset the generation of the first impulse signal 620 and the second flipflop 604 may reset the generation of the second impulse signal 622 utilizing the reset signal 626. The first flipflop 602 may be adapted to detect a first rising edge of the input reference signal 616, and the second flipflop 604 may be adapted to detect a second rising edge of the input divided signal 618. If the input reference signal 616 leads the input divided signal 618, the first flipflop 602 may generate the first impulse signal 620. Duration of the first impulse signal may comprise a duration beginning at the start of the first rising edge of the reference signal 616 and ending at a delayed time. The delay may be determined by the programmable delay, after a start of the first rising edge of the input divided signal 618.

If the input reference signal 616 lags the input divided signal 618, the second flipflop 604 may generate the second impulse signal 622. A duration of the second impulse signal 622 may comprise a duration beginning at a start of a first rising edge of the input divided signal 618 and ending at a delayed time. The delay may be determined by the programmable delay, after a start of the first rising edge of the input reference signal 616. If the input reference signal 616 leads the input divided signal 618, circuitry may be utilized that generates a positive charge for controlling the input divided signal 618, based on the generated first impulse signal 620. If the input reference signal 616 lags the input divided signal 618, circuitry may be utilized that generates a negative charge for controlling the input divided signal 618, based on the generated second impulse signal 622.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for locking a phase locked loop (PLL), the method comprising:
   generating a first impulse signal utilizing an input reference signal;
   generating a second impulse signal utilizing an input divided signal;
   generating at least one programmable delay signal for each of said generated first impulse signal and said generated second impulse signal using a delay control signal; and
   controlling said generation of said first impulse signal and said generation of said second impulse signal via said generated at least one programmable delay signal.

2. The method according to claim 1, comprising delaying said generated first impulse signal and said generated second impulse signal utilizing at least one programmable delay.

3. The method according to claim 2, comprising ANDing said delayed first impulse signal and said delayed second impulse signal to generate said at least one programmable delay signal.

4. The method according to claim 1, wherein said generated at least one programmable delay signal comprises a reset signal.

5. The method according to claim 4, comprising resetting said generation of said first impulse signal and said second impulse signal utilizing said reset signal.

6. The method according to claim 1, comprising detecting a first rising edge of said input reference signal.

7. The method according to claim 6, comprising detecting a second rising edge of said input divided signal.

8. The method according to claim 7, comprising, if said input reference signal leads said input divided signal, generating said first impulse signal, wherein a duration of said first impulse signal begins at a start of rising of said first rising edge and ends at a subsequent time determined by said at least one programmable delay.

9. The method according to claim 7, comprising, if said input reference signal lags said input divided signal, generating said second impulse signal, wherein a duration of said second impulse signal begins at a start of rising of said second rising edge and ends at a subsequent time determined by said at least one programmable delay.

10. The method according to claim 7, comprising, if said input reference signal leads said input divided signal, generating a positive charge for controlling said input divided signal, utilizing said generated first impulse signal.

11. The method according to claim 7, comprising, if said input reference signal lags said input divided signal, generating a negative charge for controlling said input divided signal, utilizing said generated second impulse signal.

12. A system for locking a phase locked loop (PLL), the system comprising:
   a first flipflop that generates a first impulse signal utilizing an input reference signal;
   a second flipflop that generates a second impulse signal utilizing an input divided signal;
   programmable delay circuitry that generates at least one programmable delay signal for each of said generated first impulse signal and said generated second impulse signal using a delay control signal,
   wherein said first flipflop controls said generation of said first impulse signal and said second flipflop controls said generation of said second impulse signal via said generated at least one programmable delay signal.

13. The system according to claim 12, wherein said programmable delay circuitry delays said generated first impulse signal and said generated second impulse signal.

14. The system according to claim 13, comprising an AND gate that ANDs said delayed first impulse signal and said delayed second impulse signal to generate said at least one programmable delay signal.

15. The system according to claim 12, wherein said generated at least one programmable delay signal comprises a reset signal.

16. The system according to claim 15, wherein said first flipflop resets said generation of said first impulse signal and said second flipflop resets said generation of said second impulse signal utilizing said reset signal.

17. The system according to claim 12, wherein said first flipflop detects a first rising edge of said input reference signal.

18. The system according to claim 17, wherein said second flipflop detects a second rising edge of said input divided signal.

19. The system according to claim 18, wherein, if said input reference signal leads said input divided signal, said first flipflop generates said first impulse signal, wherein a duration of said first impulse signal begins at a start of rising of said first rising edge and ends at a subsequent time determined by said at least one programmable delay.

20. The system according to claim 18, wherein, if said input reference signal lags said input divided signal, said second flipflop generates said second impulse signal, wherein a duration of said second impulse signal begins at a start of rising of said second rising edge and ends at a subsequent time determined by said at least one programmable delay.

21. The system according to claim 18, comprising circuitry that generates a positive charge for controlling said input divided signal, utilizing said generated first impulse signal, if said input reference signal leads said input divided signal.

22. The system according to claim 18, comprising circuitry that generates a negative charge for controlling said input divided signal, utilizing said generated second impulse signal, if said input reference signal lags said input divided signal.

* * * * *